United States Patent
In et al.

(10) Patent No.: US 8,207,763 B1
(45) Date of Patent: Jun. 26, 2012

(54) NON-LINEAR CHANNELIZER DEVICE WITH WIDEBAND, HIGH-FREQUENCY OPERATION AND CHANNEL RECONFIGURABILITY

(75) Inventors: Visarath In, Chula Vista, CA (US); Patrick Anton Longhini, San Diego, CA (US); Yong (Andy) An Kho, Chula Vista, CA (US); Joseph D. Neff, San Diego, CA (US); Norman Liu, San Mateo, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 121 days.

(21) Appl. No.: 12/826,451

(22) Filed: Jun. 29, 2010

(51) Int. Cl.
*H03B 19/00* (2006.01)
(52) U.S. Cl. ............. 327/117; 331/57; 331/55; 370/343
(58) Field of Classification Search .................. 327/117; 331/57, 55; 370/343
See application file for complete search history.

(56) References Cited

U.S. PATENT DOCUMENTS

| | | | | |
|---|---|---|---|---|
| 5,359,301 | A * | 10/1994 | Candage | 331/57 |
| 5,917,383 | A * | 6/1999 | Tso et al. | 331/57 |
| 6,008,642 | A | 12/1999 | Bulsara et al. | |
| 6,020,782 | A | 2/2000 | Albert et al. | |
| 7,196,590 | B1 | 3/2007 | In et al. | |
| 7,420,366 | B1 * | 9/2008 | In et al. | 324/253 |
| 7,528,606 | B1 | 5/2009 | In et al. | |
| 7,714,671 | B1 * | 5/2010 | In et al. | 331/57 |
| 7,777,535 | B1 * | 8/2010 | In et al. | 327/117 |
| 7,902,931 | B1 * | 3/2011 | In et al. | 331/55 |
| 2005/0068114 | A1 * | 3/2005 | Liu | 331/57 |
| 2006/0262891 | A1 * | 11/2006 | Faulkner | 375/371 |
| 2010/0079220 | A1 * | 4/2010 | Trott et al. | 333/126 |

OTHER PUBLICATIONS

V. In, A. Bulsara, A. Palacios, P. Longhini, A. Kho, J. Neff, "Coupling-Induced Oscillations in Overdamped Bistable Systems," Physical Review E 68, Rapid Communication (2003), 045102-1.
V. In, A. Palacios, A. Bulsara, P. Longhini, A. Kho, J. Neff, "Complex Behavior in Driven Unidirectinoally Coupled Overdamped Duffing Elements," Physical Review E 73 (2006), 066121.
V. In, A. Bulsara, A. Palacios, P. Longhini, A. Kho, "Complex Dynamics in Unidirectinoally Coupled Overdamped Bistable Systems Subject to a Time-Periodic External Signal," Physical Review E72 (2005), 04510R.
A. Bulsara, V. In, A. Kho, P. Longhini, A. Palacios, W-J. Rappel, J. Acebron, S. Baglio, B. Ando. Emergent Oscillations in Unidirectionally Coupled Overdamped Bistable Systems, Physical Review E 70 (2004), 036103-1-12.
P. Longhini, A. Palacios, V. In, J. Neff, A. Kho, A. Bulsara, "Exploiting Dynamical Symmetry in Coupled Nonlinear Elements for Efficient Frequency Down-conversion," Physical Review E 76 (2007), 02620.

* cited by examiner

*Primary Examiner* — Ryan Jager
(74) *Attorney, Agent, or Firm* — Ryan J. Friedl; Kyle Eppele

(57) ABSTRACT

A semiconductor non-linear channelizer device comprises an array of N first order, bi-stable semiconductor circuit cells. The circuit cells are uni-directionally coupled from a first circuit cell to another circuit cell, where N is an integer greater than 1. A signal input trace is coupled to each of the circuit cells and a signal output trace is coupled from each of the circuit cells.

6 Claims, 11 Drawing Sheets

NON-LINEAR CHANNELIZER DEVICE WITH WIDEBAND, HIGH-FREQUENCY OPERATION AND CHANNEL RECONFIGURABILITY

FEDERALLY-SPONSORED RESEARCH AND DEVELOPMENT

The Non-Linear Channelizer Device With Wideband, High-Frequency Operation and Channel Reconfigurability is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email ssc_pac_T2@navy.mil. Reference Navy Case Number 100033.

CROSS-REFERENCE TO RELATED APPLICATION(S)

This application claims the benefit of U.S. patent application Ser. No. 12/561,996, titled "Device Realization of Efficient Frequency Down-Conversion for High Frequency Communication Systems Via Arrays of Coupled Nonlinear Dynamic Elements", filed Sep. 17, 2009; Ser. No. 12/391,508, titled "Circuit Devices for Implementation in Wideband Nonlinear Channelizer", filed Feb. 24, 2009; Ser. No. 12/125,397, titled "Exploiting Dynamical Symmetry in Coupled Nonlinear Elements for Efficient Frequency Down-Conversion", filed May 22, 2008; and Ser. No. 12/752,262, titled "Coupled Electric Field Sensors for DC Target Electric Field Detection", filed Jul. 30, 2008, the contents of each application hereby incorporated by reference in their entirety.

BACKGROUND

Channelizers used in conventional communication systems rely on arrays of matched filters to partition the input radio-frequency signal into sections that are then passed on to the signal processing chain. These filters are typically fixed in their operation with regard to the frequency range over which they operate and they can be large depending on the way they are constructed. New methods and systems for channelization are desired, particularly with systems that offer wideband, high-frequency operation, compact implementation, and channel reconfigurability.

SUMMARY OF SOME EMBODIMENTS

The following presents a simplified summary in order to provide a basic understanding of some aspects of the claimed subject matter. This summary is not an extensive overview, and is not intended to identify key/critical elements or to delineate the scope of the claimed subject matter. Its purpose is to present some concepts in a simplified form as a prelude to the more detailed description that is presented later.

In one aspect of the disclosed embodiments, a semiconductor non-linear channelizer device is provided, comprising: an array of N 1st-order, bi-stable semiconductor circuit cells, uni-directionally coupled, from a first circuit cell to another circuit cell, where N is an integer greater than 1; a signal input trace to each of the circuit cells; and a signal output trace from each of the circuit cells.

In another aspect of the disclosed embodiments, a method for channel configurability is provided, comprising: fabricating a semiconductor channelizer device, comprising: uni-directionally coupling an array of N over-damped, bi-stable semiconductor circuit cells, where N is an integer greater than 1; coupling a signal input trace to each of the circuit cells; and coupling a signal output trace from each of the circuit cells.

DETAILED DESCRIPTION OF SOME EMBODIMENTS

Figure 1:
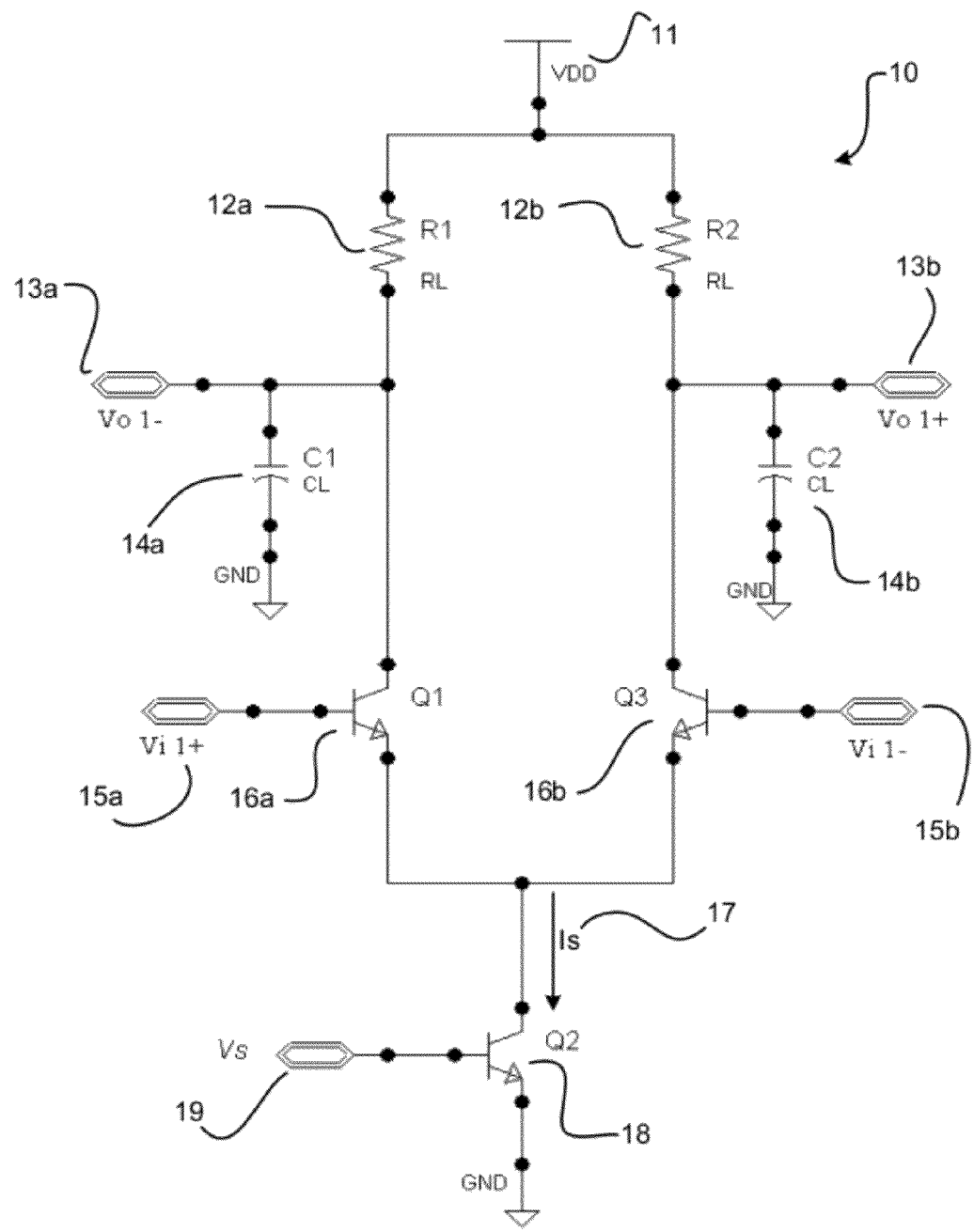
FIG. 1 is a circuit schematic illustration of an exemplary single operational transconductance amplifier (OTA).

For the purposes of this disclosure, a "channel" is understood as one or more allocations of frequency ranges, or frequency bands. A "channelizer" is a device that may receive/transmit incoming signals, separate the signals into a plurality of different channels based upon the frequency range of each individual channel, and provide the individual channels to some other device.

First order and unforced dynamical systems do not oscillate. However, well-designed coupling schemes, together with the appropriate choice(s) of initial conditions can induce oscillations when a control parameter is triggered. This capability has been demonstrated in issued and co-pending patent applications by the inventors, having Ser. No. 12/561,996, corresponding to NC #99771, titled "Device Realization of Efficient Frequency Down-Conversion for High Frequency Communication Systems Via Arrays of Coupled Nonlinear Dynamic Elements"; Ser. No. 12/391,508, corresponding to NC #99373, titled "Circuit Devices for Implementation in Wideband Nonlinear Channelizer"; Ser. No. 12/125,397, corresponding to NC #98827, titled "Exploiting Dynamical Symmetry in Coupled Nonlinear Elements for Efficient Frequency Down-Conversion"; Ser. No. 11/755,601, corresponding to NC #98411, titled "Wideband Non-linear Channelizer for Rapid Processing for Static and Time-periodic Signals", now issued as U.S. Pat. No. 7,714,671; Ser. No. 10/874,009, corresponding to NC #95759, titled "Coupled Nonlinear Sensor System", now issued as U.S. Pat. No. 7,420,366; Ser. No. 11/732,678, corresponding to NC #96761, titled "Coupled Nonlinear Sensor for Time-Dependent (AC) Target Signal", now issued as U.S. Pat. No. 7,528,606; and Ser. No. 12/752,262, corresponding to NC #97455, titled "Coupled Electric Field Sensors for DC Target Electric Field Detection", the disclosures of which are incorporated by reference herein in their entirety.

These above principles have been generally demonstrated using a soft-potential, mean-field description of the dynamics in a (hysteretic) single-domain, ferromagnetic sample. Using a specific (uni-directional, with cyclic boundary conditions) coupling scheme, together with non-identical initial conditions, the coupled system of N elements (each element being a "soft" ferromagnetic core) can oscillate when the coupling coefficient is swept through a critical value. The ensuing oscillations have found utility in the detection of very weak time invariant (dc) target magnetic signals, via their effect on the oscillation characteristics. Time-dependent (ac) magnetic signals can also be detected through a variety of cooperative oscillatory phenomena that occur when interacting with the internal coupled core dynamics.

The systems that have been studied (and applied) to date are described generally in the context of injection locked electronic ring oscillators. The overall concept is, however, far more general (universal) and can be demonstrated in nearly any nonlinear oscillator so long as the oscillators' internal dynamics operate on a time scale that is commensurate with the signal of interest and the two are coupled appropriately. While, in principle, the nature of the nonlinearity can be chosen in many ways, in this disclosure a particular choice of nonlinearity is made, with its own particular dynamics that permit the detection and processing of input signals over a large bandwidth (MHz to Ghz).

The embodiments described herein are derived from the generation of internal oscillations in coupled, nonlinear, dynamic systems that do not normally (i.e., absent the coupling) oscillate. The described systems comprise uni-directionally coupled nonlinear 1st-order bistable elements. The frequency and other dynamical characteristics of the emergent oscillations depend on the systems and target signal parameters. Hence, the system can be used to detect and/or quantify time dependent target signals such as those found in modulated signals used in communications. When supplied with a time-dependent signal, the described systems offer the advantage of extremely rapid response (for example, on a time-scale of nano-seconds when operating at GHz frequencies) and wide bandwidth.

In a hardware implementation described herein, modulated signals for frequencies ranging from a few hundred MHz up to 4 GHz, for example, can be accommodated. The various disclosed systems demonstrate significant performance enhancements over standard systems. Details of the exemplary chip-level implementations are described below. A brief introduction to nonlinear channelizer theory is presented, wherein additional details are found in the above-incorporated documents.

FIG. 1 is a circuit schematic illustration of a single operational transconductance amplifier (OTA) 10, or referred to in the alternative as a subunit. The single OTA 10 can be formed from parallel circuit branches fed by supply voltage $V_{DD}$ 11, containing load resistors (R1) 12a and (R2) 12b, shunted load capacitors (C1) 14a and (C2) 14b with output nodes $V_{o1-}$ 13a and $V_{o1+}$ 13b, and transistors (Q1) 16a and (Q3) 16b with input nodes $V_{i1+}$ 15a and 15b. The parallel circuit branches are tied to the drain of a third transistor (Q2) 18 that provides a bias current $I_{bias}$ 17 which is divided between the two branches. $I_{bias}$ 17 is controlled by the terminal $V_s$ 19. The source terminal of the third transistor 18 is connected to the supply voltage Gnd It should be noted that while the transistors shown in FIG. 1 are illustrated as emitter-coupled logic (ECL) transistors, different transistor types may be used, as according to design preference. The OTA subunit 10 can be placed into an array (later described) which is analogous to an overdamped, bistable system containing a hyperbolic tangent function as the nonlinear term, which arises from using OTA 10 as the function generator. Presuming $R1=R2=R_L$ and $C1=C2=C_L$, the dynamics are derived from Kirchoffs junction law at the output nodes, $V_{o1+}$ 13b and $V_{o1-}$ 13a, as shown in FIG. 1 and is given empirically as $$C_L * dV_{o1}/dt = -gV_{o1} + I_{bias} \tan h(\beta_s V_{i1}), \quad (1)$$

where $\beta_s$ (a transistor parameter typically fixed after fabrication), g, and $I_s$ 17 control the bistability of the energy function of the subunit. g is linear conductance (or its equivalent $1/R_L$), $R_L$ is the linear resistance, $C_L$ is the total parasitic capacitance at the output nodes $V_{o1-}$ 13a and $V_{o1+}$ 13b, $V_{i1}$ is the differential voltage input of the subunit (i.e., $V_{i1}=V_{i1+}-V_{i1-}$), and $V_{o1}$ is the differential voltage output of the subunit (i.e., $V_{o1}=V_{o1+}-V_{o1-}$).

When multiple subunits are coupled uni-directionally to form an exemplary channelizer, the dynamics of the entire system are suitably described by the following general equation:

$$C_L * \dot{V}_i = -gV_i - I_C \tan h(\beta_C * V_{i-1}) + I_S \tan h(\beta_S * V_i) + I_g \tan h(\beta_g * V_{sig}) \quad (2)$$

where "˙" is the time derivative. The variable $V_i$ represents the voltage output of the $i^{th}$ subunit in a uni-directionally coupled N-element ring oscillator, where $i=0, 1, \ldots, N-1$; $I_c$, $I_s$ and $I_g$ are bias currents which control the nonlinear terms in the system; $\beta_C$, $\beta_S$ and $\beta_g$ are device parameters relating to the coupling, feedback and signal input differential pairs, respectively, as shown, for example, in FIG. 2, and to a first approximation are fixed after fabrication. $V_{sig}$ is the external input signal. It is understood that $I_c$ and $\beta_c$ control the coupling strength inside the array of subunits. By using the input signal through a nonlinear term indicated by the last term of Eq. 2, a circuit device realization can be obtained. As will be demonstrated below, this provides a more efficient and more responsive system to the low energy signal input, as compared to prior systems.

Figure 2:
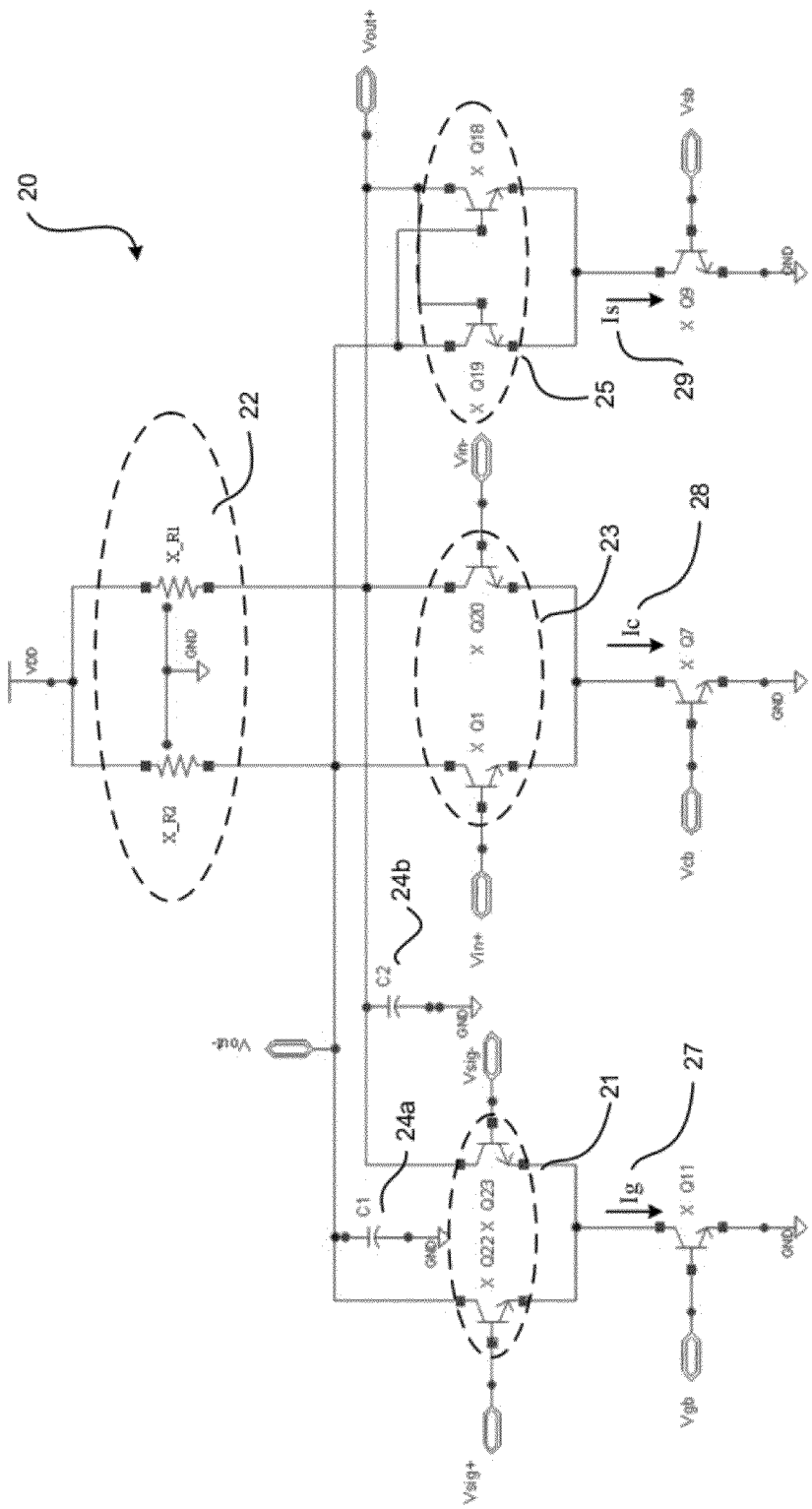
FIG. 2 is a schematic illustration of an exemplary single bistable element.

FIG. 2 is a schematic illustration of a single oscillator element 20 formed by three coupled transistor differential pairs, using bi-polar junction transistors (BJT) as active devices. Other types/forms of active devices may be used according to design preference, such as CMOS, MOSFET, etc. FIG. 2's circuit schematic 20 is based on Eq. 2, where the general form of an OTA shown in FIG. 1 is arranged in a coupled manner (21, 23, 25) to result in the coupled oscillator element 20. Recognizing the hyperbolic tangent terms in Eq. 2 can be realized by an OTA with a (BJT) differential pair, three hyperbolic tangent terms are formed, where the linear conductance g in Eq. 2 can be realized by using a pair of resistors 22 as the load of the differential pair.

This single oscillator element cell 20 is fully differential (i.e. differential input to differential output) which is understood to provide good immunity to common-mode noise. Also, this means in Eq. 2, $V_i$ represents the differential voltage output of the $i^{th}$ element; and $V_{sig}$ represents the differential external input signal. Also, $C_p$, corresponding to C1 (24a) and C2 (24b) in FIG. 2, is equivalent to $C_L$ in Eq. 2, which is the total parasitic capacitance of each output node. For each OTA in the single oscillator element 20, the three tail currents, $I_g$ 27, $I_c$ 28, and $I_s$ 29, can be adjusted by using a biasing circuit, for example, as described in FIG. 3.

Figure 3:
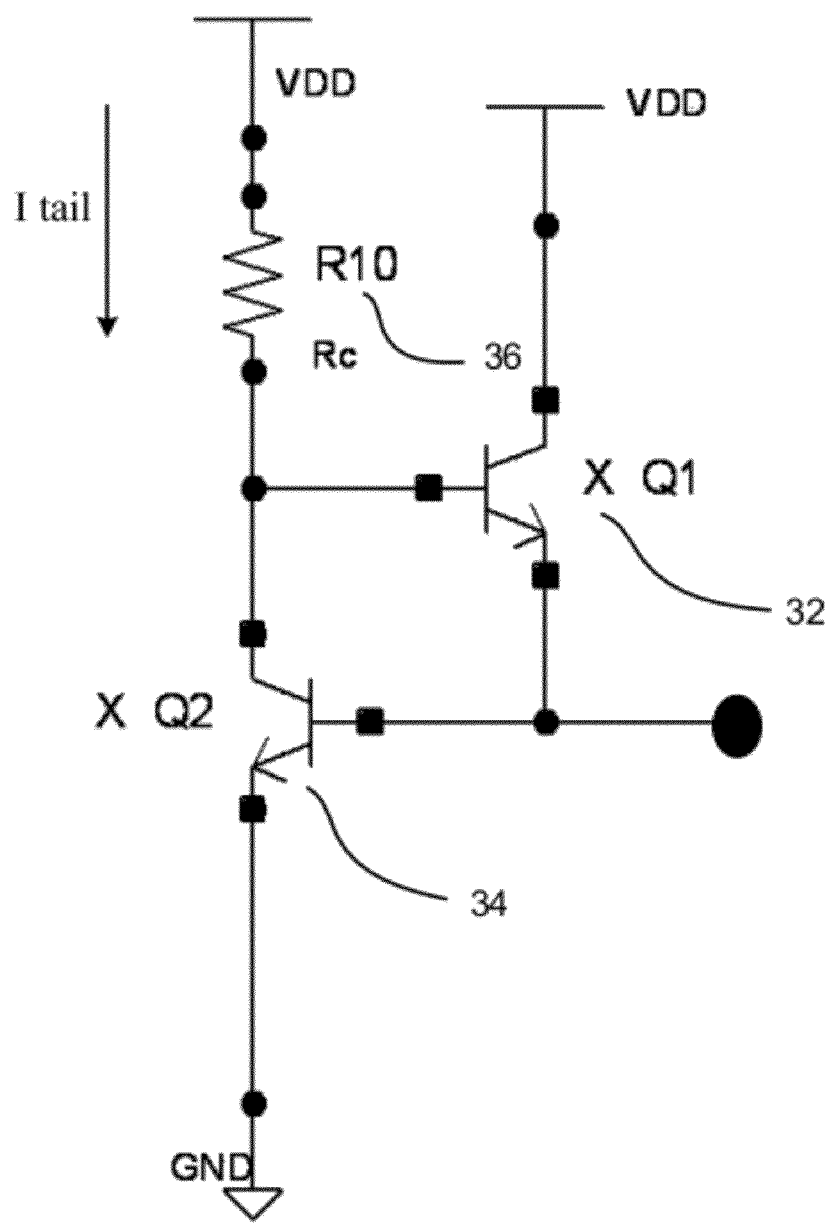
FIG. 3 is schematic illustration of an exemplary tail biasing circuit.

FIG. 3 is schematic illustration of an exemplary circuit capable of providing a tail biasing current $I_{tail}$ for an exemplary OTA. The exemplary biasing circuit can be as simple as two transistors X Q1 32 and X Q2 34 configured in the manner shown in FIG. 3. For each OTA, one copy of the exemplary biasing circuit can be used for each of the three tail currents. Using the example from FIG. 2, the tail currents are $I_g$, $I_c$, and $I_s$. The base of the NPN transistor X Q2 34 of each copy is connected to either node $V_{gb}$, $V_{cb}$ or $V_{sb}$ (shown in FIG. 2) of each exemplary OTA element. Resistor R10 36 can be an off-chip resistor, which can be replaced by a variable resistor, to set the value of each tail current. In the exemplary embodiments, the tail current for the respective biasing circuit was adjusted according to the following expression: $I \approx (V_{dd} - 2*V_{be})/R_c$, where $V_{dd}$ is the supply voltage, $V_{be}$ is the forward-biased voltage of the base-emitter junction of the two NPN transistors 32, 34 (assuming they are have the same $V_{be}$), and $R_c$ is the value of the off-chip resistor R10 36. As noted above, depending on circuit implementation, non-NPN transistors may be utilized, with appropriate modifications that are within the scope of one of ordinary skill in the art. It should also be appreciated that the tail biasing currents described herein may be generated from voltages (utilizing Norton equivalences, for example), therefore various embodiments herein may be driven by voltages as an alternative to currents. Accordingly, the use of voltages as a driving parameter may be utilized without departing from the spirit and scope herein.

Figure 4:
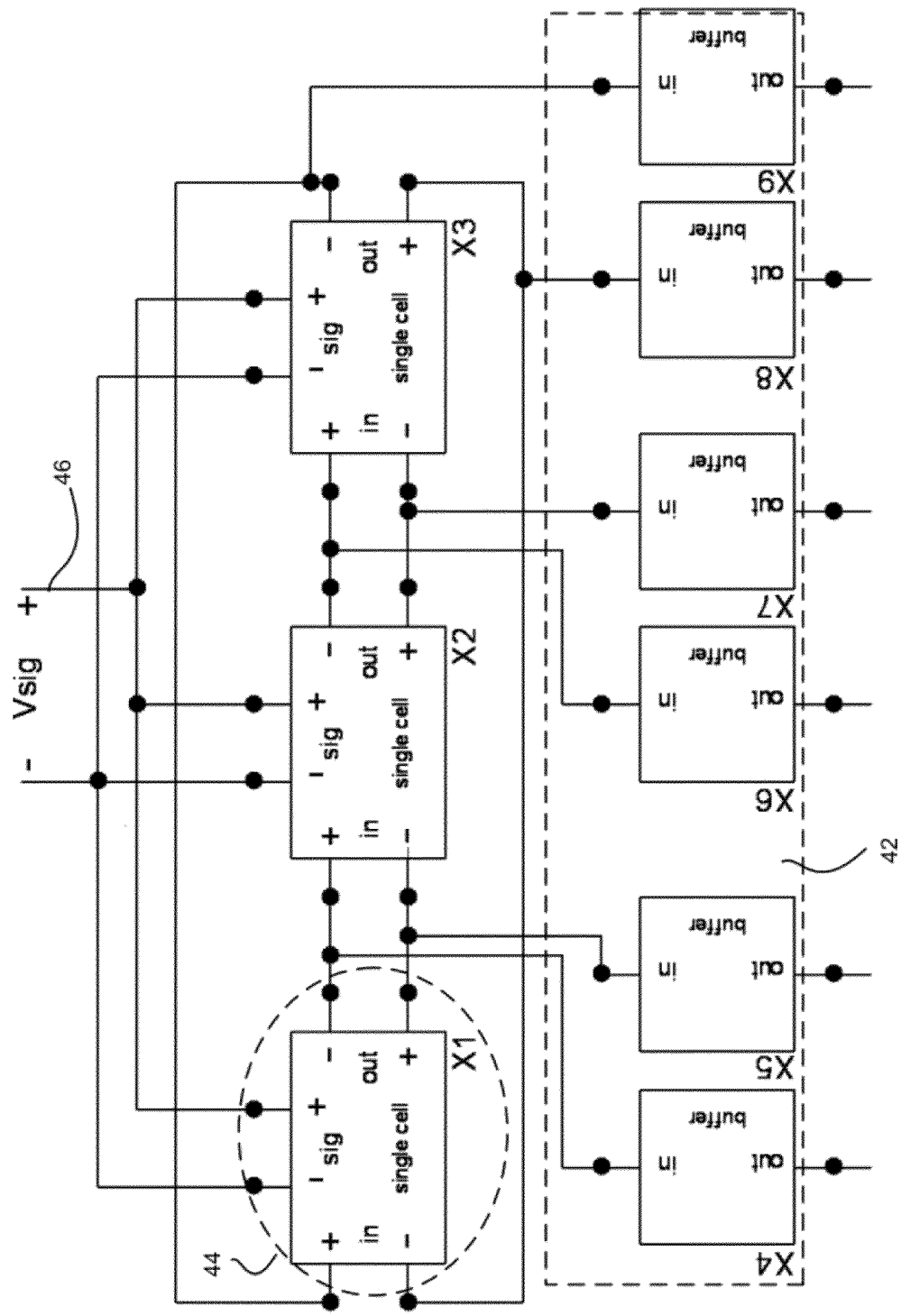
FIG. 4 is a diagram of an exemplary coupled 3-element ring oscillator with on chip buffers.

FIG. 4 is an input/output connection diagram of an exemplary coupled 3-element ring oscillator with "on-chip" buffers 42. An external input signal $V_{sig}$ 46 is injected to each OTA/element 44 having an input differential pair (see FIG. 2). The differential outputs of each element 44 are connected to on-chip buffers 42 which operate to rapidly load/un-load data without the inherent propagation delays that incur with off-chip buffers.

Figure 5:
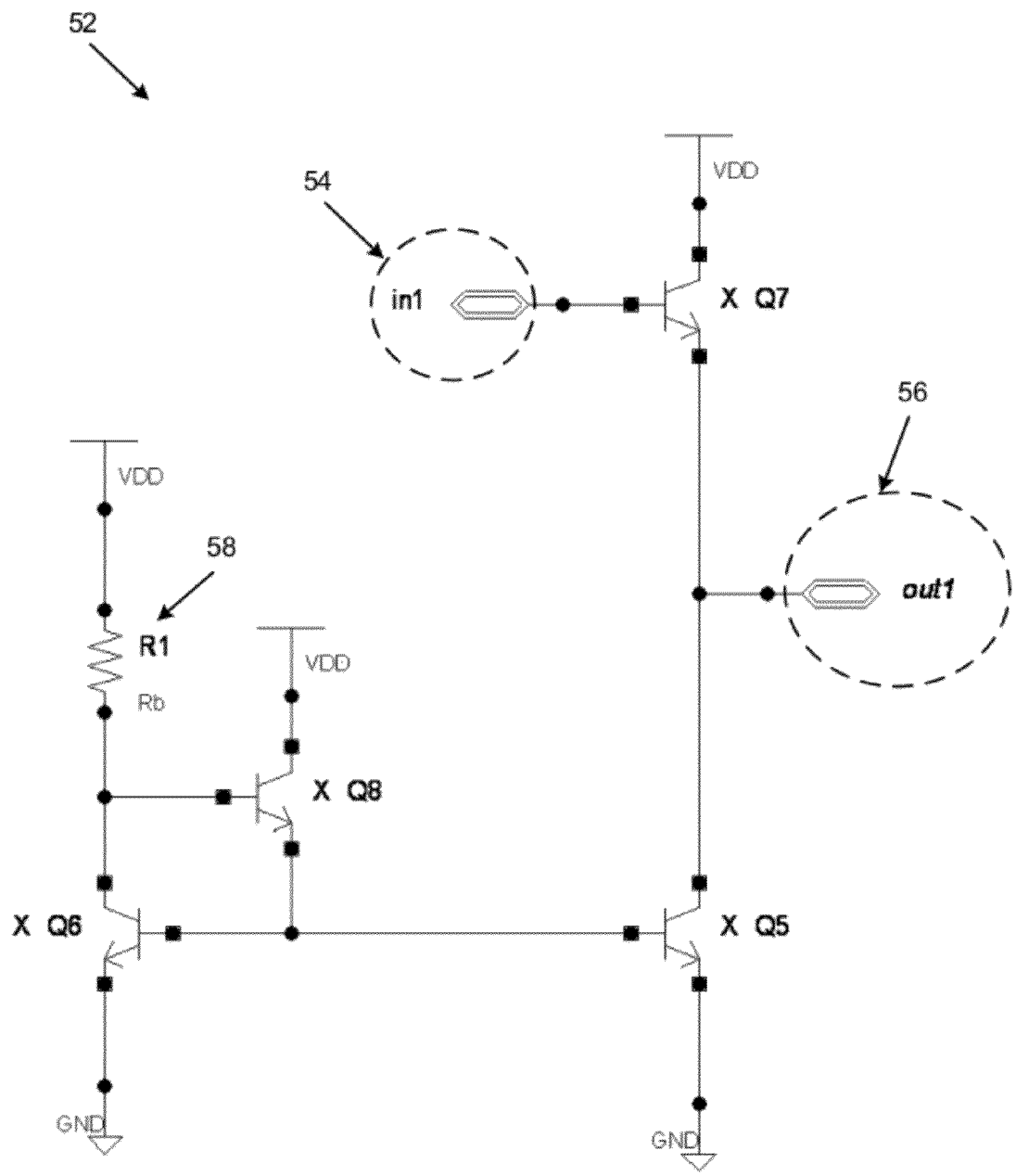
FIG. 5 is an illustration of an exemplary on-chip buffer circuit suitable for use with the exemplary ring oscillator of FIG. 4.

FIG. 5 illustrates an exemplary "on-chip" buffer circuit 52 suitable for use with the exemplary ring oscillator of FIG. 4. The buffer input 54 is connected to either $V_{out+}$ or $V_{out-}$ (as seen in FIG. 2) of each element. FIG. 5 shows a buffer output 56 as well as an off-chip resistor 58 that may be used to bias the circuit. The exemplary on-chip buffer circuit 52 may utilize an emitter-follower stage with biasing, coupled in the manner shown, and is understood to be self-explanatory. Buffering circuits are known in the art and therefore are not elaborated herein.

Figure 6:
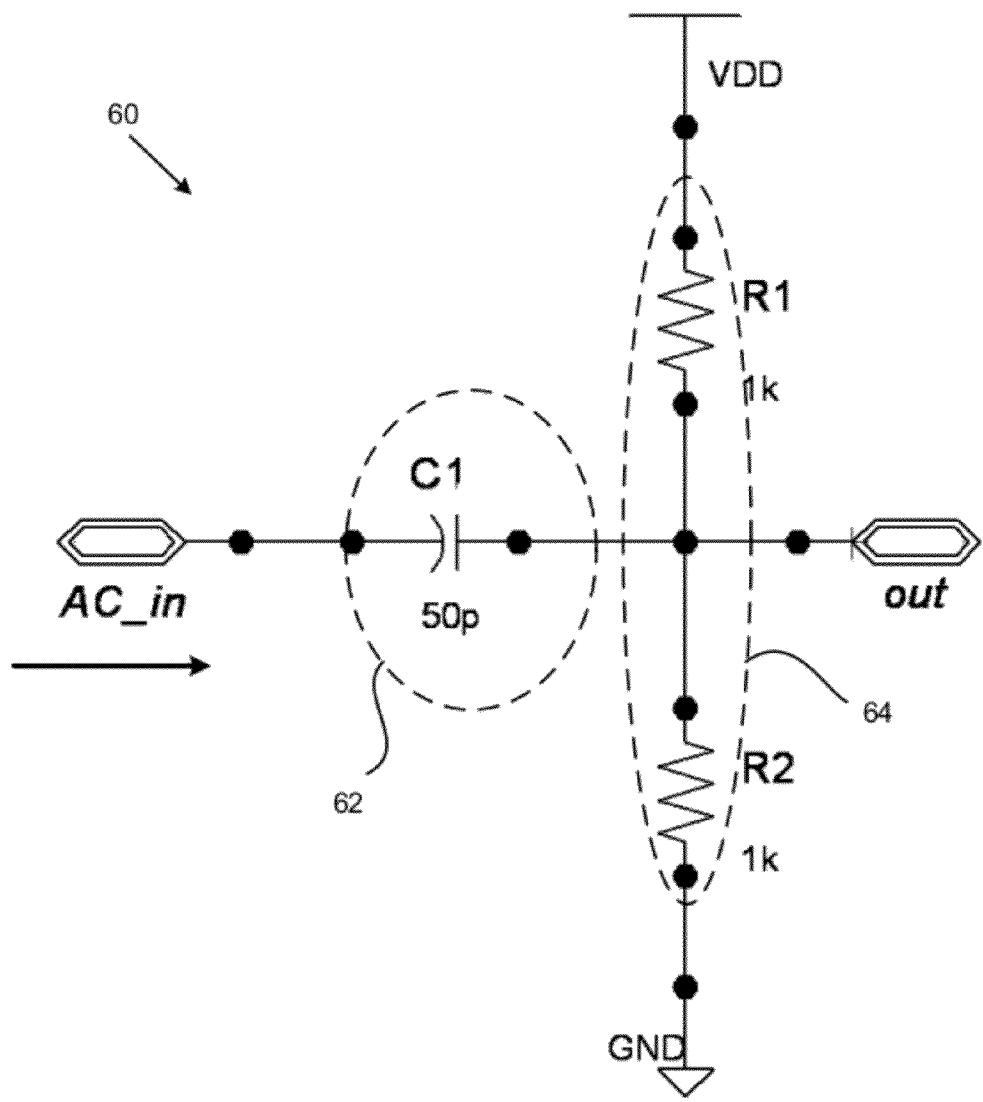
FIG. 6 is a schematic illustration of an exemplary off-chip biasing network.

FIG. 6 is a schematic of an exemplary "off-chip" biasing network 60, including a DC decoupling capacitor 62 and resistors 64 for providing DC for the OTAs. The node "out" is connected to either $V_{sig+}$ or $V_{sig-}$ (as in FIG. 2) and the node "AC_in" is connected to an AC input signal. Network 60 provides the proper bias for a differential pair while decoupling any DC voltage from the input signal. Terminal biasing networks and circuits are well known in the art and are not further elaborated herein.

Figure 7:
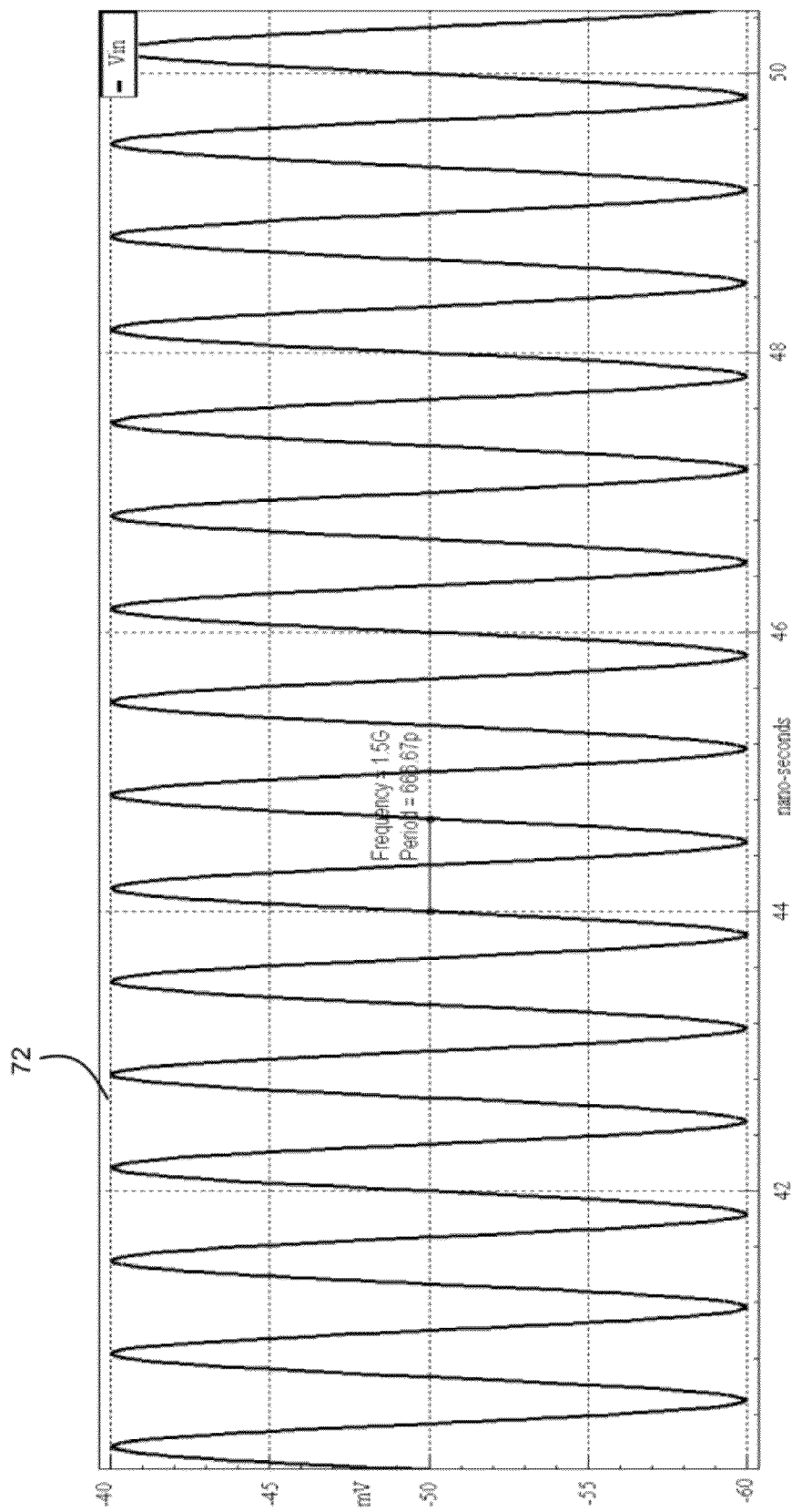
FIG. 7 is a plot of a simulated input voltage for an exemplary 3-element Channelizer.
Figure 8:
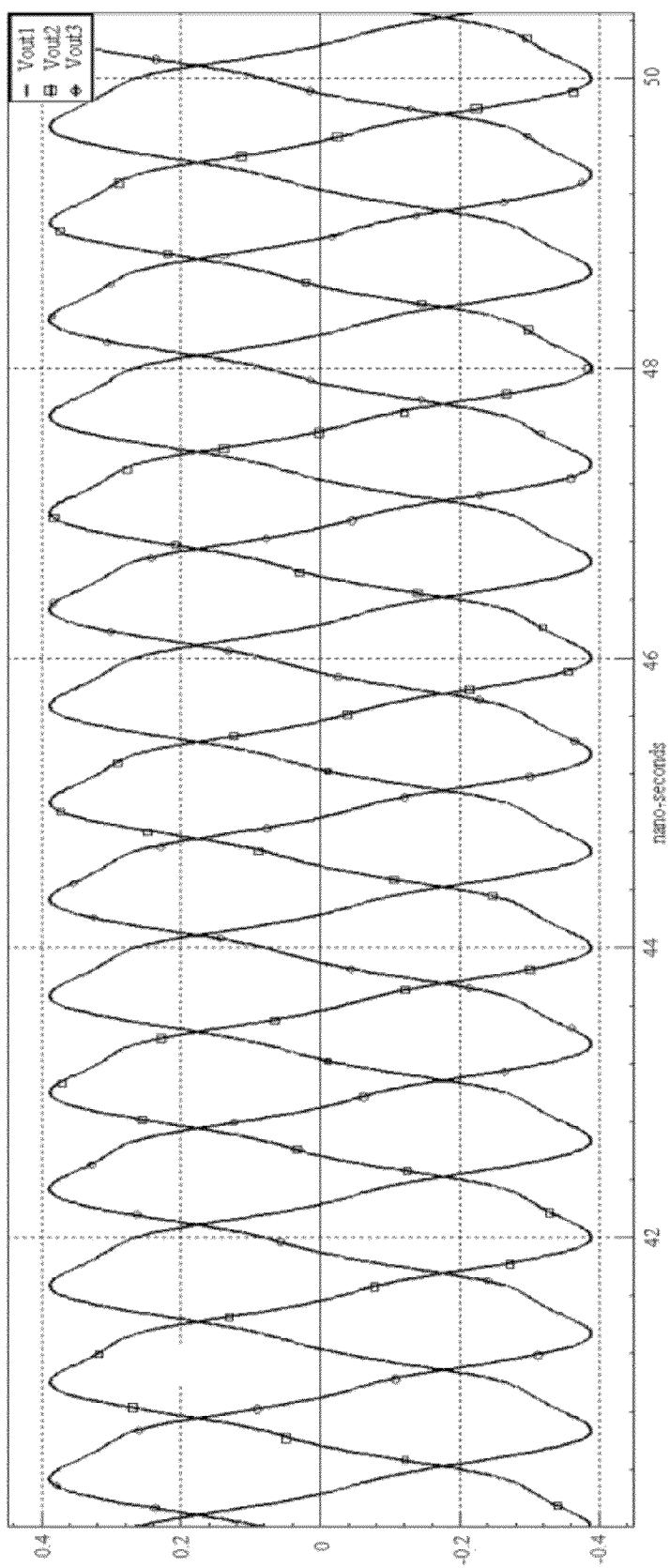
FIG. 8 is a plot of a simulated output voltage of an exemplary 3-element Channelizer based on the plot of FIG. 7.

FIGS. 7-8 are voltage plots from a Simulated Program with Integrated Circuit Emphasis (SPICE) of the exemplary 3-element Channelizer described above, with an input sine wave of 1.5 GHz having an amplitude of 10 mV. FIG. 7 is a plot of the input sine waveform 72 while FIG. 8 is a plot of the output waveforms. For these plots, each element in the exemplary 3-element Channelizer is preset to oscillate at around 500 MHz with parameters of approximately $I_c$=555 µA, $I_s$=600 µA, $I_g$=100 µA, $g$=1/250$\Omega^{-1}$ and $C_L$=0.1 pF. FIG. 8 shows that the differential buffered output of each element of the exemplary 3-element Channelizer locks approximately onto one-third of the frequency of the input signal (500 MHz). The three outputs are approximately 120 degrees out of phase from one another. By super positioning the three output signals, a single harmonic signal can be obtained, for increased sensitivity.

Figure 9:
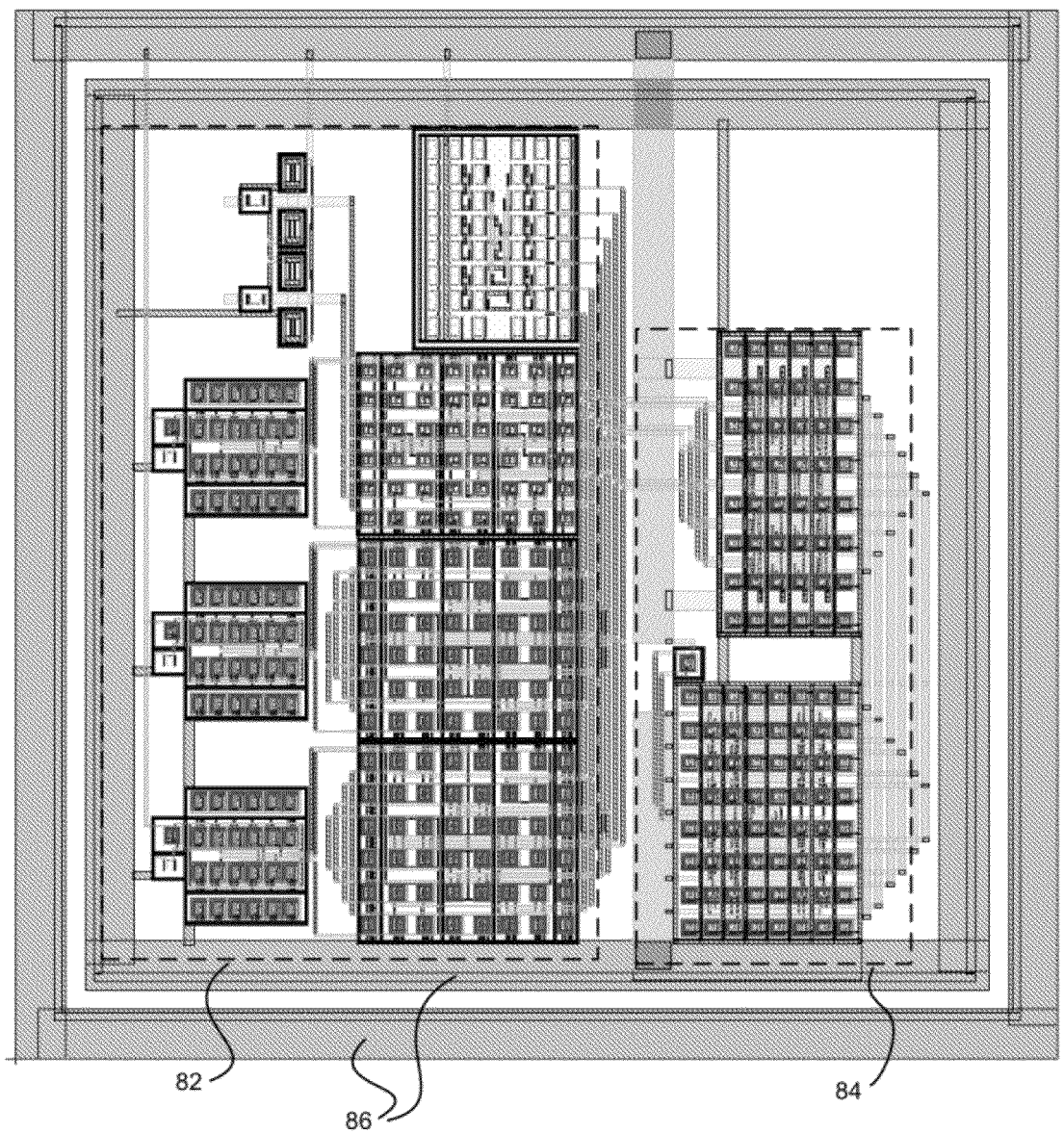
FIG. 9 is a mask layout image of an exemplary 3-element Channelizer fabricated with optional guard rings.

FIG. 9 is a layout mask of an exemplary 3-element semiconductor-based Channelizer die fabricated using a 0.35 µm process (e.g., Jazz Semiconductor's SiGe BiCMOS-SBC35qtx). The layout image for the exemplary 3-element Channelizer is displayed showing coupled 3-element rings 82 with output buffers 84. Two optional guard rings 86, which are placed within the two thick outer rectangular blocks surrounding the chip structure, are utilized to minimize channel cross-talk (oscillation interference) from the adjacent channels. Since the die contains multiple channels, minimizing the cross-talk between channels is an important issue, enabling each individual channel to be as quiet as possible to preserve the purity of the captured signals. However, depending on design and/or performance requirements, the guard rings 86 may not be implemented, as well as the "on-chip" output buffers 84.

Figure 10:
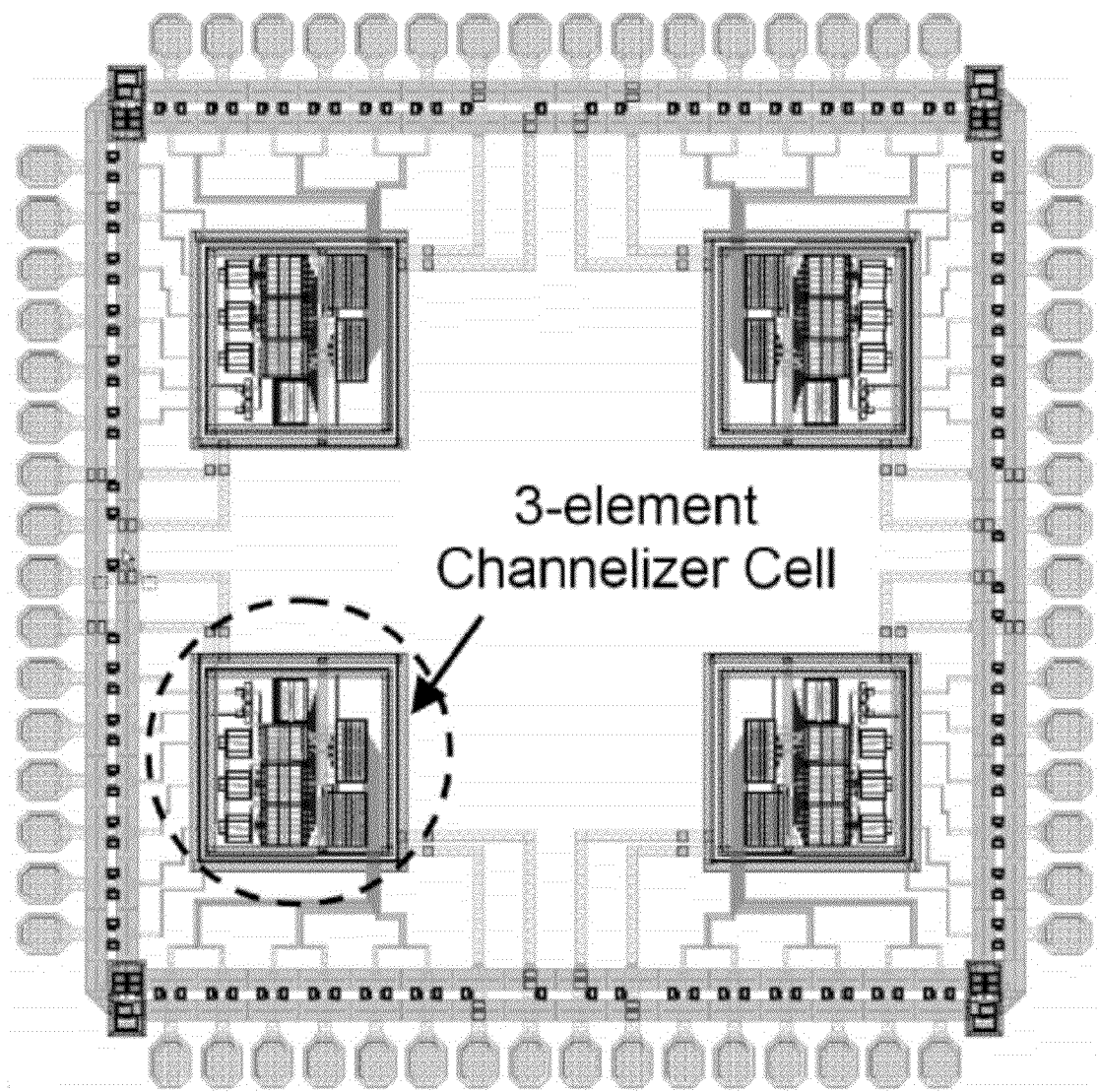
FIG. 10 is a chip layout image of multiple exemplary 3-element Channelizers.

FIG. 10 is a layout image of four exemplary 3-element Channelizers for a semiconductor fabricated chip. The image is configured for a chip size of 5 mm×5 mm. Four channels are implemented on this example to provide proof of concept. It should be understood that depending on the dimensions utilized in the mask, material type, die size, and chip size, many configurations could be implemented for specific applications. Additionally, multi-chip or multi-die configurations may be implemented.

Figure 11:
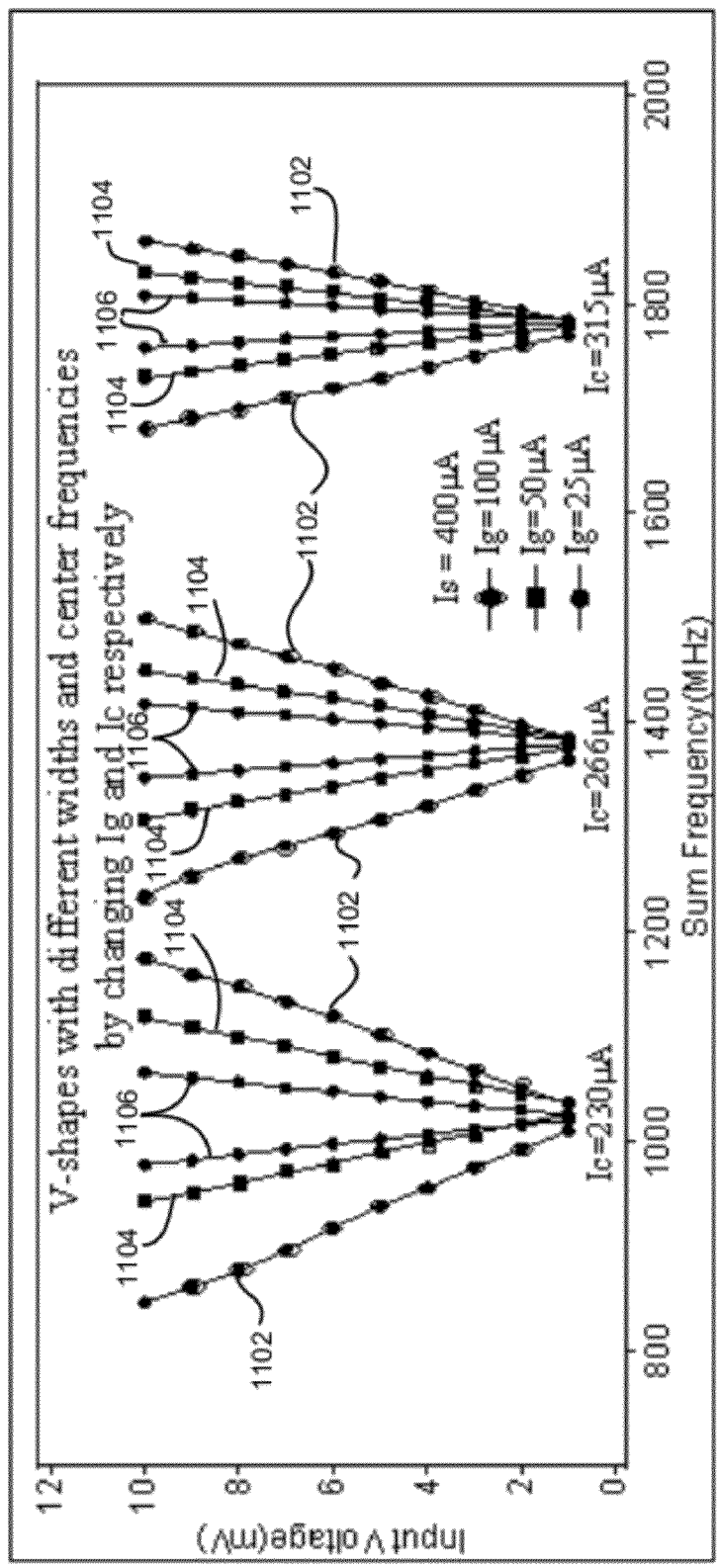
FIG. 11 is a plot showing the configurability of an exemplary 3-element Channelizer by adjusting tail currents.

FIG. 11 is a plot showing actual measurement results from a semiconductor-fabricated 3-element Channelizer demonstrating configurability by adjusting only the $I_g$ and $I_c$ values. The exemplary fabricated 3-element Channelizer was fabricated using Ga—As as the substrate medium. Of course, other materials, non-limiting examples being Silicon or Sapphire, may be used. Analogously, other fabrication schemes that are lithographically or non-lithographically based may also be used.

With $I_s$ arbitrarily fixed at 400 µA, the $I_c$ parameter can be tuned either to be at approximately 1.0 GHz, 1.4 GHz, or 1.8 GHz with values $I_c$=230 µA, 266 µA, or 315 µA, respectively. The locking range of the channel can be controlled by changing the values of $I_g$ to either creating a wide channel as indicated by outer V-shape 1102, the intermediate channel width indicated by the intermediate V-shape 1104, or the narrower V-shape 1106. The reconfigurability (moving and shaping) of the channel is a very useful feature in monitoring a broad range of signals in the RF spectrum.

An exemplary channelizer can be tuned for channel's placement in the desired frequency space and to configure the desired channel width (bandwidth), which can be accomplished by tuning at least one of the three accessible system parameters $I_s$, $I_c$, and $I_g$ (for a 3-element channnelizer). In the embodiments disclosed, the parameters can be controlled by resistors, which may be employed off-chip, to control the bias currents of the channelizer circuitry. Other forms of control may be used according to design preference.

The exemplary systems(s) can accept any arbitrary radio frequency signals that are within the locking range of the channel. These signals can take the form of modulations such as binary phase shift keying (BPSK), quadrature shift keying (QPSK), code division multiple access (CDMA), frequency hopping spread spectrum (FHSS), orthogonal frequency division multiplexing (OFDM), or Link-16 or other modulation schemes that are applicable.

By implementation of a functional hardware/chip design, several features or capabilities of the exemplary non-linear Channelizer have been demonstrated. For example, the exemplary hardware design shown is capable of operating between 1-4 GHz and is suitable for a range RF frequency communication needs. Higher frequencies or lower frequencies are also possible. As discussed above, the implementation of additional guard rings around the channels provides protection from the adjacent channels cross-talk (interference from the neighboring channels). The buffers have been designed to be integrated into the channel for better signal output characteristic and to isolate the nonlinear oscillators in the channel from interferences given by the circuit components to be integrated to such analog-to-digital converters (ADCs) etc.

The channels can operate in the oscillation mode in the absence of the input signal. This provides a narrower channel bandwidth configuration than the non-oscillatory mode as compared to the two operational modes of the exemplary device. This oscillatory mode also provides a quicker lock-on speed (or response) to the input signal than the non-oscillatory mode.

The exemplary design demonstrated is capable of locking onto input signals down to −55 dBm of signal power for modulated signal formats. Once the exemplary channelizer locks onto the input signal, it can provide an improved output signal-to-noise ratio over that of the input signal due to the large amplitude response of the oscillators. The output signal of each of the oscillators in the channel configuration is practically the same regardless of the input signal power once it has sufficient power to provide a lock-on. This is extremely important for RF communication systems where constant output amplitudes are required to optimally use the dynamic range of ADCs. The ability to provide constant output amplitude from each oscillator in the exemplary Channelizer can be predicted and quantified via the circuit components used and the chip power supply.

Additionally, the output signal from each of the oscillators in a channel can be phased shifted from its counterpart by 120 degrees, if three elements are used in the channel configuration. In general, if N (using an odd number) is used in the channel configuration, then each is phase shifted by $2\pi/N$. The output signal from each of the oscillators in the channel can also be frequency down-converted by a factor of N (i.e. 1/N of the input signal's frequency) when the system is locked-on to the input signal when using three elements for channel configuration. In general, if N is used in channel configuration, then frequency down-conversion is by a factor of 1/N. This is an important characteristic in that the exemplary system has the ability to down-convert the signal's frequency without relying on additional electronics, thus reducing demands on back-end electronics such as ADC's and other components which are frequency limited (usually around 240 MHz according to contemporary standards).

Due to the fact that the output from each oscillator in the channel is phase shifted from the oscillators by $2\pi/N$, the sampling of the signal can be reduced by a factor of 1/N of the input frequency. This is important since it lowers the minimum operating frequency (Nyquist frequency) of a sampling analog-to-digital converter for post-processing purposes. Afterwards, the signal may be reassembled, for example, using a time-interleaving method to recover the original signal for demodulation.

As discussed above, three tunable parameters are used in the exemplary channelizer so that the channels can be configured as desired by the users. These parameters are $I_s$, $I_g$, and $I_c$. For channel configuration in terms of the center frequency (natural oscillation frequency of the channelizer) and the bandwidth of the channel (relative frequency range of the channel's boundaries), these parameters may be set to appropriate values by simple electronic devices such as digital potentiometers (resistors). In this scenario, the channel's characteristics can be programmable by the user.

In the various embodiments described above, $I_s$ and $I_c$ were configured to mainly control the setting of the center frequency of the channel, with $I_g$ configured to mainly control the setting of the width of the channel.

In some implementations, the signal input OTA for the exemplary Channelizer chip was optimized so that the matching network on the implementation board can be designed and efficiently matched to accept wider frequency bands. In these "hardware" embodiments, the exemplary Channelizer design is capable of taking wideband signals with input power ranging from −7 dBm to −55 dBm.

Different differential designs were used for the exemplary Channelizer chip which is known to provide better immunity to common mode noise. With the understanding that common noise immunity may be sacrificed, one of ordinary skill may employ similar differential designs, rather than different differential designs. It is known that by employing a balun or similar single ended device to the input (or output) of a differential device, the common mode noise can be reduced.

Many modifications and variations of the Non-Linear Channelizer Device With Wideband, High-Frequency Operation and Channel Reconfigurability are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by a person having ordinary skill in the art.

We claim:

1. A device comprising:
    an array of N first order, non-linear bi-stable uni-directionally coupled elements, where N is an integer greater than 1, wherein each element comprises more than one bi-polar junction transistor differential pairs;
    a buffer circuit coupled to the output of each element, each element further comprising a buffer biasing circuit configured to bias the buffer circuit; and
    at least one guard ring surrounding the array and the buffer circuits.

2. The device of claim 1, wherein each element further comprises an input signal biasing circuit configured to bias an input signal to the element.

3. The device of claim 1 further comprising a channel biasing circuit connected to each element, wherein a channel center frequency and a channel bandwidth are each controlled by the biasing circuit.

4. The device of claim 3, wherein the channel biasing circuit comprises a variable resistive element.

5. The device of claim 1, wherein a frequency output from each element is 1/N of the frequency of an input signal to the particular element.

6. The device of claim 5, wherein the frequency output of each element is phase shifted by $2\pi/N$ from the phase of the input signal to the particular element.

* * * * *